(12) United States Patent
Kim

(10) Patent No.: US 10,242,975 B2
(45) Date of Patent: Mar. 26, 2019

(54) FLEXIBLE DISPLAY APPARATUS

(71) Applicant: Samsung Display Co., Ltd., Yongin-si, Gyeonggi-do (KR)

(72) Inventor: Mugyeom Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/484,202

(22) Filed: Apr. 11, 2017

(65) Prior Publication Data

US 2017/0294425 A1    Oct. 12, 2017

(30) Foreign Application Priority Data

Apr. 11, 2016  (KR) .................. 10-2016-0044260

(51) Int. Cl.
| | | |
|---|---|---|
| H01L 29/205 | (2006.01) | |
| H01L 25/16 | (2006.01) | |
| H01L 51/00 | (2006.01) | |
| H01L 51/52 | (2006.01) | |
| H01L 27/12 | (2006.01) | |
| H01L 27/28 | (2006.01) | |
| H01L 27/32 | (2006.01) | |

(52) U.S. Cl.
CPC ........ *H01L 25/167* (2013.01); *H01L 27/1218* (2013.01); *H01L 27/326* (2013.01); *H01L 51/0097* (2013.01); *H01L 51/5253* (2013.01); *H01L 27/286* (2013.01); *H01L 27/3225* (2013.01); *H01L 2251/5338* (2013.01); *Y02E 10/549* (2013.01)

(58) Field of Classification Search
CPC .............. H01L 25/167; H01L 51/5253; H01L 27/3262; H01L 27/3258; H01L 27/286; H01L 51/0097; H01L 27/1214; H01L 33/0008
See application file for complete search history.

(56) References Cited

U.S. PATENT DOCUMENTS

| | | | |
|---|---|---|---|
| 8,976,141 B2 | 3/2015 | Myers et al. | |
| 2011/0115693 A1* | 5/2011 | Kim .................... | G09G 3/003 |
| | | | 345/76 |
| 2013/0081756 A1 | 4/2013 | Franklin et al. | |
| 2013/0292711 A1* | 11/2013 | Ogihara ............. | H01L 25/0753 |
| | | | 257/88 |
| 2015/0168776 A1 | 6/2015 | Song et al. | |
| 2016/0041663 A1* | 2/2016 | Chen .................. | G06F 3/0412 |
| | | | 345/174 |

FOREIGN PATENT DOCUMENTS

KR    1020150071536 A    6/2015

* cited by examiner

*Primary Examiner* — Stephen Bradley
*Assistant Examiner* — Wasiul Haider
(74) *Attorney, Agent, or Firm* — Cantor Colburn LLP

(57) ABSTRACT

A flexible display apparatus includes: a flexible substrate including a first surface and a second surface which is opposite to the first surface; a first display unit which displays an image with light and is on the first surface of the flexible substrate, the first display unit including a transmission area at which light from the flexible substrate passes through the first display unit to outside the first display unit; and a second display unit which displays an image with light and is on the second surface of the flexible substrate, the second display unit disposed corresponding to the transmission area of the first display unit on the first surface of the flexible substrate.

18 Claims, 4 Drawing Sheets

FLEXIBLE DISPLAY APPARATUS

This application claims priority to Korean Patent Application No. 10-2016-0044260, filed on Apr. 11, 2016, and all the benefits accruing therefrom under 35 U.S.C. § 119, the content of which in its entirety is herein incorporated by reference.

BACKGROUND

1. Field

One or more embodiments relate to a flexible display apparatus, and more particularly, to a flexible display apparatus that is relatively easily bent.

2. Description of the Related Art

Among display apparatuses, an organic light-emitting display apparatus has advantages such as relative wide viewing angles, a high contrast ratio and fast response rates and thus has drawn attention as a next-generation display apparatus.

In general, when the organic light-emitting display apparatus is manufactured, thin film transistors and organic light-emitting devices are formed on a substrate, and the organic light-emitting devices generate and emit light during operation of the organic light-emitting apparatus. The organic light-emitting display apparatus is used as a display unit of a relatively small product such as a cell phone or a display unit of a relatively large product such as a television ("TV").

Light-emitting diodes ("LED"s) convert electrical signals into light such as infrared rays or visible rays based on characteristics of a compound semiconductor and are used in home appliances, remote controls, electric display boards, various automatic devices, or the like. LEDs have been used in an increasing number of areas from relatively small hand-held electronic devices to relatively large display devices.

SUMMARY

In a conventional flexible display apparatus, an insulating layer and a light-emitting element are disposed on a flexible substrate at a bending area of the flexible display apparatus. Due to bending of the flexible display apparatus at the bending area, the insulating layer may be damaged such as by cracking, and defects may occur in the light-emitting element due to the cracking of the insulating layer.

One or more embodiments of the invention include a flexible display apparatus that is relatively easily bent so as to solve problems including the problem described above. However, this is an example and does not pose a limitation on the scope of the present disclosure.

According to one or more embodiments, a flexible display apparatus includes: a flexible substrate including a first surface and a second surface which is opposite to the first surface; a first display unit which displays an image with light and is on the first surface of the flexible substrate, the first display unit including a transmission area at which light from the flexible substrate passes through the first display unit to outside the first display unit; and a second display unit which displays an image with light and is on the second surface of the flexible substrate, the second display unit disposed corresponding to the transmission area of the first display unit on the first surface of the flexible substrate.

The flexible substrate may include a bending area at which the flexible display apparatus is bent and a non-bending area at which the flexible display apparatus is not bent. The transmission area of the first display unit may be disposed at the bending area of the flexible substrate.

The first display unit may include a first light-emitting element which generates light of the first display unit. The first light-emitting element includes: a pixel electrode, an opposite electrode opposite to the pixel electrode, and an intermediate layer between the pixel electrode and the opposite electrode and comprising an emission layer.

The second display unit may include a second light-emitting element which is disposed at the transmission area of the first display unit and generates light of the second display unit.

The light emitted by the second light-emitting element may transmit through the flexible substrate at the transmission area of the first display unit and pass through the first display unit at the transmission area thereof to the outside of the first display unit.

At the transmission area of the first display unit, the first display unit may include an insulating layer disposed on the first surface of the flexible substrate, and a first opening may be defined in the insulating layer of the first display unit, the first opening defining a transparent window of the transmission area at which the light from the flexible substrate passes through the first display unit to the outside of the first display unit.

The second light-emitting element on the second surface of the flexible substrate may be disposed at the first opening of the first display unit disposed on the first surface of the flexible substrate.

The flexible substrate may further include a bending area at which the flexible display apparatus is bent and a non-bending area at which the flexible display apparatus is not bent, the second display unit may be disposed at the bending area of the flexible substrate and the flexible display apparatus may further include a protection film on the second surface of the flexible substrate at the non-bending area of the flexible substrate.

The protection film on the second surface of the flexible substrate may be disposed non-overlapping the second display unit on the second surface of the flexible substrate.

The flexible display apparatus may further include an adhesive layer between the second display unit and the second surface of the flexible substrate. The adhesive layer may have transparency.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
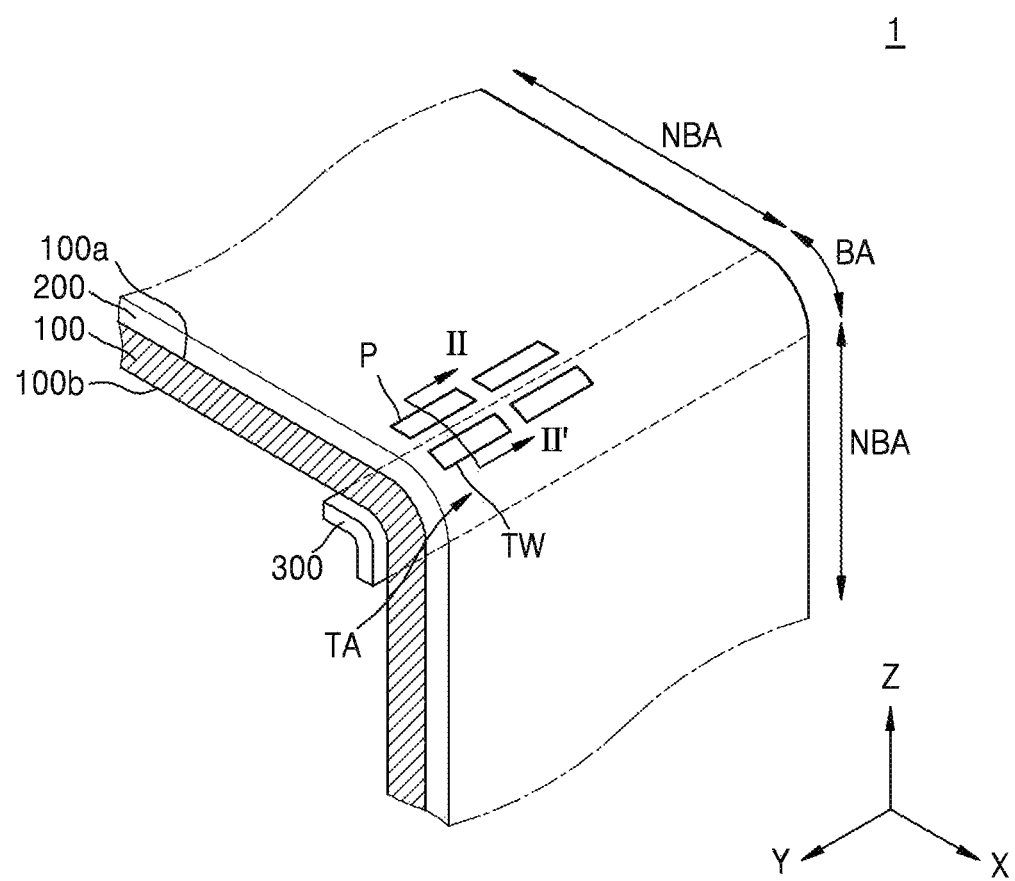
FIG. 1 is a schematic perspective view of an embodiment of a flexible display apparatus according to the invention.

As the present disclosure allows for various changes and numerous embodiments, particular embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The present disclosure may, however, be embodied in many different forms and should not be construed as being limited to the embodiments set forth herein.

Hereinafter, the present disclosure will be described in detail by explaining embodiments of the present disclosure with reference to the attached drawings. Like reference numerals in the drawings denote like elements.

It will be understood that although the terms "first," "second," etc. may be used herein to describe various components, these components should not be limited by these terms. These components are only used to distinguish one component from another.

As used herein, the singular forms "a", "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present. In contrast, when an element is referred to as being "directly on" another element, there are no intervening elements present.

Sizes of components in the drawings may be exaggerated for convenience of explanation. In other words, since sizes and thicknesses of components in the drawings are arbitrarily illustrated for convenience of explanation, the following embodiments are not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Due to a growing interest in flexible display apparatuses among organic light-emitting display apparatuses, research into flexible organic light-emitting display apparatuses has been actively conducted. Glass substrates are generally used as a base substrate to manufacture flexible display apparatuses. However, flexible substrates including, for example, synthetic resin, have been recently used as the base substrate to implement flexible display apparatuses.

Figure 2:
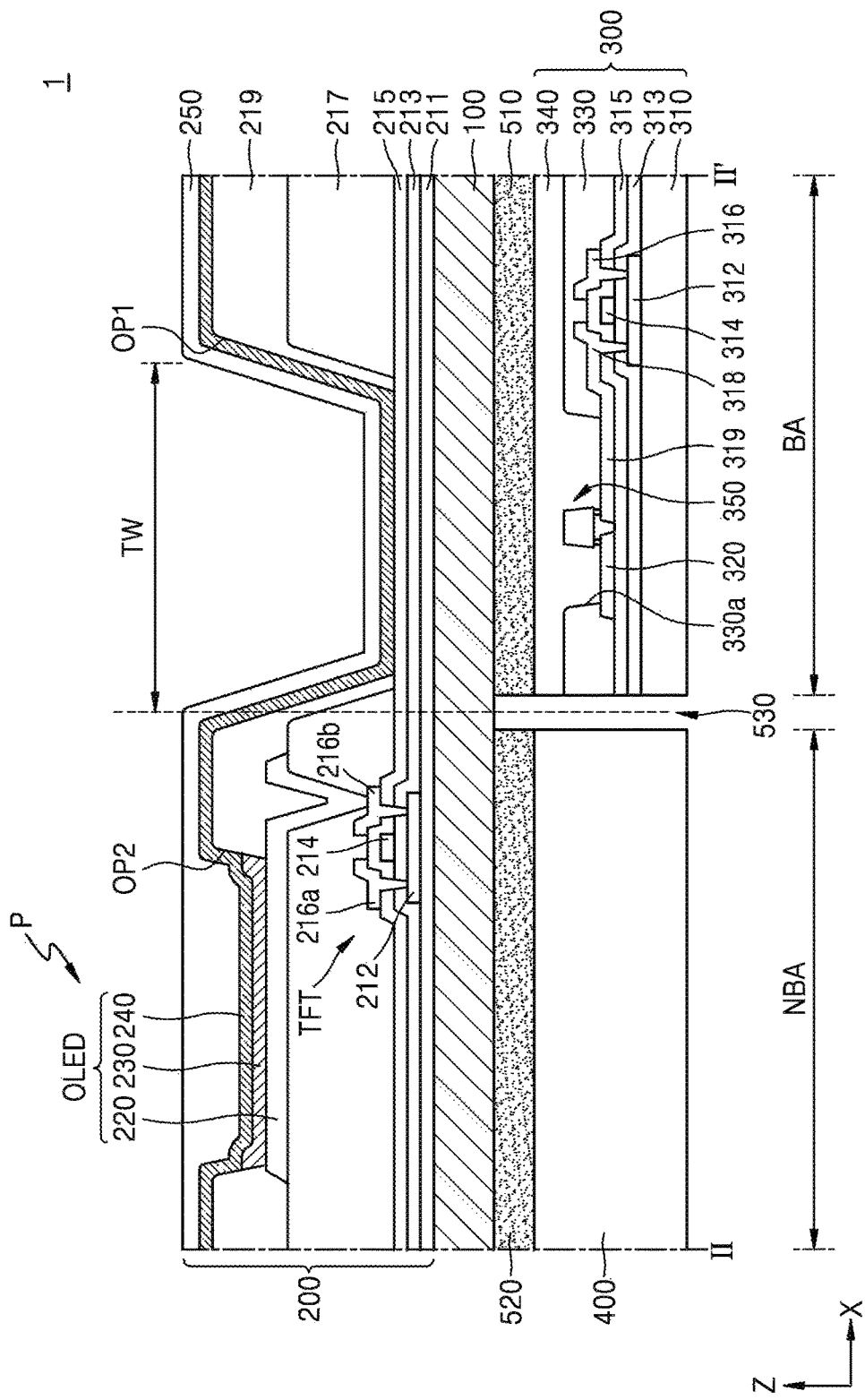
FIG. 2 is a schematic cross-sectional view taken along line II-II' of the flexible display apparatus of FIG. 1.

FIG. 1 is a schematic perspective view of an embodiment of a flexible display apparatus 1 according to the invention. FIG. 2 is a schematic cross-sectional view taken along line II-II' of the flexible display apparatus 1 of FIG. 1. The flexible display apparatus 1 is shown in a bent state in FIG. 1. The bent flexible display apparatus 1 of FIG. 1 is shown in an unbent state thereof in FIG. 2.

Referring to FIG. 1, the flexible display apparatus 1 includes a flexible (base) substrate 100 having or defining a first surface 100a, a second surface 100b, a first display unit 200 (or layer) on the first surface 100a of the flexible substrate 100 and including a transparent (or transmission) area TA, and a second display unit (or layer) 300 on the second surface 100b of the flexible substrate 100. An upper surface of the first display unit 200 may form an outermost surface of the flexible display apparatus 1 at a viewing side thereof.

The flexible substrate 100 having flexibility may be in a board form and have the first surface 100a and the second surface 100b which is opposite to the first surface 100a. The flexible substrate 100 may be extended in a plane defined by two directions, and have a thickness extended in a direction which crosses each of the two plane-directions. The flexible substrate 100 may include various materials, for example, metals, plastics such as polyethylene terephthalate ("PET"), polyethylene naphthalate ("PEN") or polyimide, or the like. The flexible substrate 100 may be extended to be flat (e.g., unbent state) or may be deformed (e.g., bent state).

The flexible substrate 100 may include a bending area BA at which the flexible display apparatus 1 is bent and a non-bending area NBA at which the flexible apparatus 1 is not bent (e.g., disposed in a respective plane). FIG. 1 shows that the bending area BA is between plural non-bending areas NBA. However, the bending area BA may be at an edge of a panel so as to not be between plural non-bending areas NBA. The bending area BA of the flexible substrate 100 (and/or the flexible display apparatus 1) is disposed adjacent to a non-bending area NBA thereof.

In addition, referring to FIG. 1, both of the non-bending areas NBA substantially form a right angle with respect to the bending area BA. However, the present disclosure is not limited thereto. An angle formed by the non-bending areas NBA with respect to the bending area BA may vary. According to an embodiment, the flexible substrate 100 may be completely folded such that the non-bending areas NBA are disposed to overlap each other in a top plan view (e.g., thickness direction of the flexible display substrate 100 and/or flexible display apparatus 1).

The first display unit 200 may be on the first surface 100a of the flexible substrate 100. As shown in FIG. 1, the first display unit 200 may be on the entire surface 100a of the flexible substrate 100. FIG. 1 shows opposing y-axis direction edges of the first display unit 200 disposed coplanar with opposing y-axis edges of the flexible substrate 100 in the y-axis direction. While not shown in FIG. 1, opposing x-axis direction edges of the first display unit 200 may similarly disposed coplanar with opposing x-axis edges of the flexible substrate 100 in the x-axis direction.

The first display unit 200 generates and displays an image with light. The first display unit 200 may include a display layer or optical medium layer, and a driving (or switching) layer which respectively controls the display or optical medium layer to generate light or to not generate light and/or to transmit light or block light. In an embodiment, the display unit 200 may include a thin film transistor ("TFT") as a switching or control element. The thin film transistor TFT may be provided in plurality within the display unit 200. The display unit 200 may be an organic light-emitting display unit including the TFTs and pixel electrodes which are connected to the TFTs to be controlled or driven thereby. In another embodiment, the display unit 200 may be a liquid crystal display unit having liquid crystal as the optical medium layer. In the illustrated embodiment, the first display unit 200 may be an organic light-emitting display unit. The first display unit 200 as the organic light-emitting display unit may include a pixel P provided in plurality such as an organic light-emitting diode ("OLED") provided in plurality. The OLED may generate and emit light of the first display unit 200.

Although not shown, a touch screen panel ("TSP") and/or a cover window may be further disposed on an upper surface of the first display unit 200 which is furthest in the thickness direction thereof from the flexible substrate 100.

The first display unit 200 may include the transparent area TA through which external light from outside the first display unit 200 (and the flexible display apparatus 1) penetrates. The external light may penetrate through an entirety of the transparent area TA or through a portion thereof. The transparent area TA may be at a location corresponding to the bending area BA of the flexible substrate 100. In the transparent area TA, a transparent window TW may be disposed. The transparent window TW may be an opening in a layer of the first display unit 200, such as a first opening OP1. The external light may penetrate through the transparent window TW portion of the transparent area TA and may not penetrate through portions thereof at which the transparent window TW is not disposed.

In the transparent area TA, an insulating layer may be placed. It may be understood that the insulating layer may collectively refer to all or some of a buffer layer 211, a gate insulating layer 213, an interlayer insulating layer 215, a planarization layer 217 and a pixel-defining layer 219. In this case, the collective insulating layer may include or define the first opening OP1, and at least one of individual layers among those of the insulating layer may include or define the first opening OP1. The first opening OP1 may be provided in plurality within the transparent area TA. The first opening OP1 may correspond to the transparent window TW of the transparent area TA. Therefore, there may be plural transparent windows TW in the overall transparent area TA. In an embodiment, one single transparent window TW may correspond to the entire transparent area TA, depending on a size of the transparent window TW. In particular, the first display unit 200 may include the planarization layer 217 and the pixel-defining layer 219 as individual insulating layers, and the transparent window TW may be formed or defined in or by the planarization layer 217 and the pixel-defining layer 219.

FIG. 2 shows that the transparent window TW is formed in and by the planarization layer 217 and the pixel-defining layer 219. However, in another embodiment, the transparent window TW may be formed in one or more individual insulating layer among the buffer layer 211, the gate insulating layer 213, the interlayer insulating layer 215, the planarization layer 217 and the pixel-defining layer 219.

Within the overall transparent area TA, there may be multiple transparent windows TW. Where the transparent window TW is provided in plurality, the transparent windows TW in the bending area BA may have sizes substantially the same as those of pixel areas PA in the non-bending area NBA (refer to the solid line rectangles in FIG. 1). As shown in FIG. 2, the pixel-defining layer 219 includes a second opening OP2 defining a pixel area PA of a pixel P. Light may be generated and/or transmitted at the pixel area PA of the pixel P, while light may not be generated at and/or transmitted by a portion of the pixel P other than the pixel area PA. The second opening OP2 may be provided in plurality to define the pixel area PA in plurality at the non-bending area NBA. The second opening OP2 (e.g., the pixel area PA) of the pixel P of the non-bending area NBA may have a same planar size as the first opening OP1 the transparent window TW of the transparent area TA.

Figure 3:
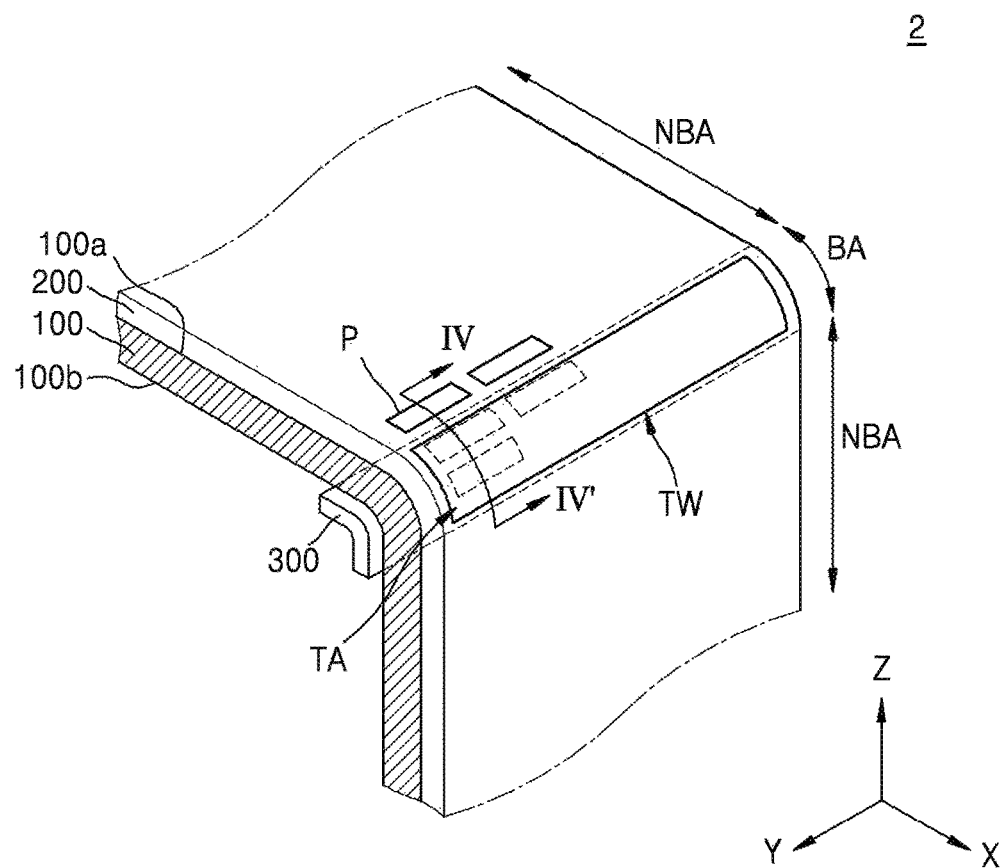
FIG. 3 is a schematic perspective view of another embodiment of a flexible display apparatus according to the invention.
Figure 4:
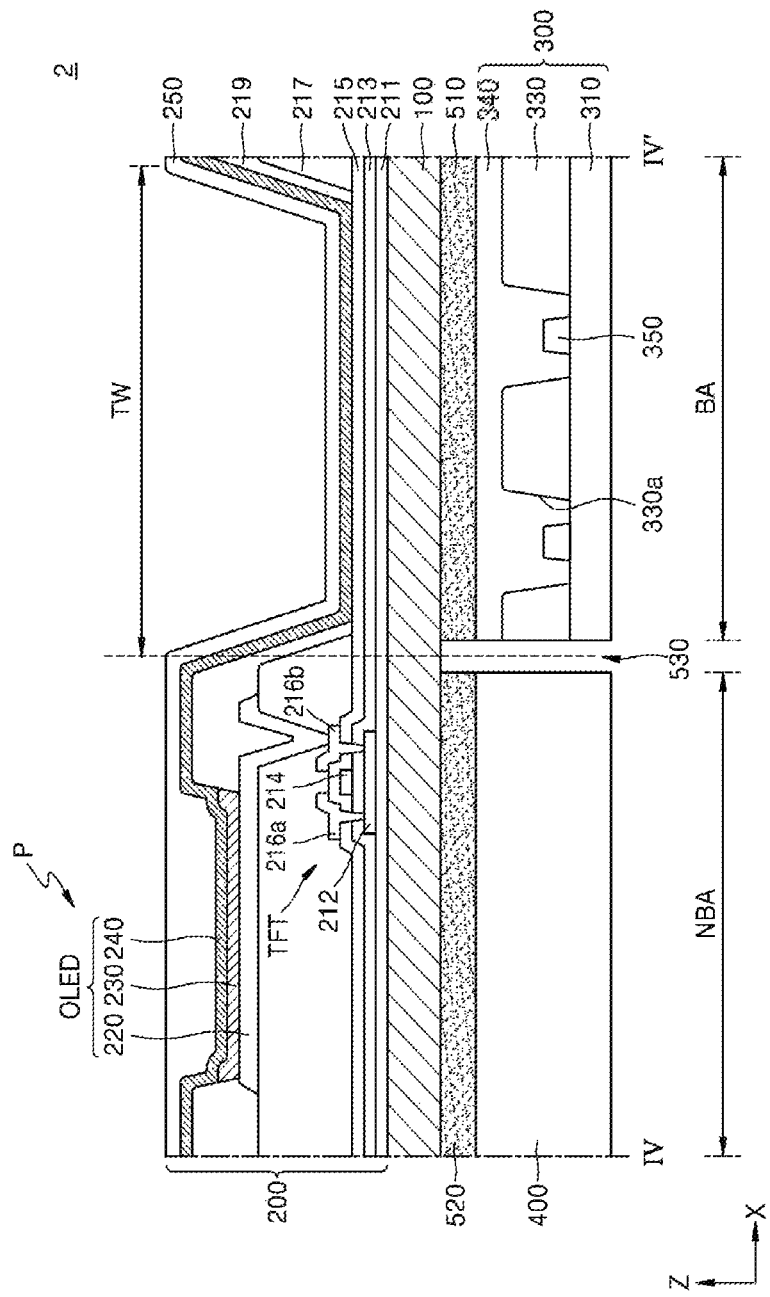
FIG. 4 is a schematic cross-sectional view taken along line IV-IV' of the flexible display apparatus of FIG. 3.

As another embodiment, as shown in FIGS. 3 and 4, a single one of the transparent window TW in the transparent area TA of the bending area BA may have a planar size greater than that of the pixel area PA in the non-bending area NBA. In FIGS. 3 and 4, a planar size of the transparent windows TW of FIGS. 1 and 2 are shown in dotted line for reference. The planar size of the single one transparent window TW as shown in FIGS. 3 and 4 may correspond to essentially an entirety of an overall planar size of the transparent area TA.

A first light-emitting element of the first display unit 200, such as the OLED, may not be placed in the transparent area TA. That is, the OLED or other non-light transmitting or generating members may not be placed in the transparent window TW in the transparent area TA. The transparent window TW may function as a window through which light emitted from the second display unit 300 towards the first display unit 200 penetrates through the flexible substrate 100 to be disposed at the upper surface of the first display unit 200. In this case, it may be understood that a transparent window has transparency or functions to have transparency to function as a light-transmitting area at which light may penetrate.

The second display unit 300 may be on the second surface 100b of the flexible substrate 100. The second display unit 300 may be a display unit including a TFT provided in plurality and a light-emitting device provided in plurality and connected to the TFTs. In the illustrated embodiment, the second display unit 300 may include a second light-emitting element such as a light-emitting diode ("LED") as a light-emitting device. The LED may be provided in plurality within the second display unit 300. The LEDs in the illustrated embodiment may be micro LEDs. Although the term 'micro' herein may indicate a size of about 1 micrometer ($\mu$m) to about 100 $\mu$m, the present disclosure is not limited thereto. The term 'micro' may be a size smaller or greater than the above-described sizes.

The first display unit 200 may be on the first surface 100a of the flexible substrate 100, and the second display unit 300 may be on the second surface 100b thereof to dispose the flexible substrate 100 therebetween. Each of the first and second display units 200 and 300 may include a discrete light-emitting element, such as an OLED or LED. As shown in FIG. 1, the flexible substrate 100 may include or define the bending area BA and the non-bending areas NBA, and the second display unit 300 may be at a location corresponding to the bending area BA of the flexible substrate 100. That is, the second display unit 300 may be on only a portion of the second surface 100b of the flexible substrate 100. In FIGS. 1 and 2, the second display unit 300 is at a location corresponding to the transparent area TA of the first display unit 200 and not corresponding to the non-bending area NBA. The light emitted from the second display unit 300 may penetrate the flexible substrate 100 and may be discharged through the transparent area TA of the first display unit 200 such as through the transparent window TW thereof.

Referring to FIGS. 1 and 2, one or more embodiment of the flexible display apparatus 1 according to the invention includes the first display unit 200 on the first surface 100a of the flexible substrate 100 and the second display unit 300 on the second surface 100b of the flexible substrate 100.

As described above, the first display unit 200 may be on the entire surface 100a of the flexible substrate 100. That is, the flexible substrate 100 may include the bending area BA and the non-bending areas NBA. The first display unit 200 may be overlapping the bending area BA and the non-bending areas NBA of the flexible substrate 100. The first display unit 200 in the non-bending areas NBA may include the pixels P each including an OLED.

On the flexible substrate 100, the buffer layer 211 may be placed to flatten a surface of the flexible substrate 100 or to reduce or effectively prevent penetration of impurities or the like into a semiconductor layer 212 of a TFT. The semiconductor layer 212 may be on the buffer layer 211. The buffer layer 211 may include silicon oxide or silicon nitride.

A gate electrode 214 is over the semiconductor layer 212 and may be electrically connected to a source electrode 216a and a drain electrode 216b according to signals transmitted to the gate electrode 214. The gate electrode 214 may be a single layer or collectively multiple layers. The gate electrode 214 may include, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu) by taking into account adhesion with adjacent layers, surface flatness of stacked layers, workability, and the like.

In this case, the gate insulating layer 213 may be between the semiconductor layer 212 and the gate electrode 214 in order to insulate the semiconductor layer 212 and the gate electrode 214 from each other. The gate insulating layer 213 may include silicon oxide and/or silicon nitride.

The interlayer insulating layer 215 may be on the gate electrode 214 and may be a single layer or collectively multiple layers including silicon oxide, silicon nitride, or the like.

The source electrode 216a and the drain electrode 216b are on the interlayer insulating layer 215. The source electrode 216a and the drain electrode 216b may respectively connected to the semiconductor layer 212 through contact holes formed in the interlayer insulating layer 215 and the gate insulating layer 213. The source electrode 216a and the drain electrode 216b may each be a single layer or collectively multiple layers including, for example, at least one of Al, Pt, Pd, Ag, Mg, Au, Ni, Nd, Ir, Cr, Li, Ca, Mo, Ti, W, and Cu by taking conductivity, etc. into account.

Although not shown, a protection layer (not shown) may cover the TFT to protect the TFT. The protection layer may include, for example, an inorganic material such as silicon oxide, silicon nitride or silicon oxynitride. The protection layer may be between the TFT and the planarization layer 217, but not being limited thereto.

The planarization layer 217 may be over the flexible substrate 100. In this case, the planarization layer 217 may be a planarization layer or a protection layer. The planarization layer 217 substantially flattens an upper surface of the TFT and protects the TFT and various devices when the OLEDs are over the upper surface of the TFT. The planarization layer 217 may include, for example, an acryl-based organic material or benzocyclobutene ("BCB"). In this case, the buffer layer 211, the gate insulating layer 213, the interlayer insulating layer 215 and the planarization layer 217 may be over the entire flexible substrate 100. However, as shown in FIG. 2, the planarization layer 217 may not be placed at the transparent window TW. In another example, some of the buffer layer 211, the gate insulating layer 213 and/or the interlayer insulating layer 215 may not be in the transparent window TW in order to increase light transparency at the transparent window TW.

The pixel-defining layer 219 may be over the upper surface of the TFT. The pixel-defining layer 219 may be over the entire flexible substrate 100 and on the planarization layer 217 described above. The pixel-defining layer 219 may define boundaries of the transparent window TW as the first opening OP1 in the bending area BA. The pixel-defining layer 219 may also define a pixel area PA as the second opening OP2 in the non-bending area NBA.

The pixel-defining layer 219 may be, for example, an organic insulating layer. The organic insulating layer may include an acryl-based polymer such as polymethyl methacrylate ("PMMA"), polystyrene ("PS"), a polymer derivative having a phenol group, an imide-based polymer, an aryl ether-based polymer, an amide-based polymer, a fluorine-based polymer, a p-xylene-based polymer, a vinyl alcohol-based polymer or any combination thereof.

The OLED may be in the non-bending area NBA. The OLED may be on the planarization layer 217 and may include a pixel electrode 220, an intermediate layer 230 including an emission layer ("EML"), and an opposite electrode 240.

The pixel electrode 220 may be a (translucent) transparent electrode or a reflective electrode. When the pixel electrode 220 is a (translucent) transparent electrode, the pixel electrode 220 may include, for example, ITO, IZO, ZnO, In$_2$O$_3$, IGO, or AZO. When the pixel electrode 220 is a reflective electrode, the pixel electrode 220 may include, for example, a reflective layer including Ag, Mg, Al, Pt, Pd, Au, Ni, Nd, Ir, Cr, or a combination thereof and a layer including indium tin oxide ("ITO"), indium zinc oxide ("IZO"), zinc oxide (ZnO), indium oxide (In$_2$O$_3$), indium gallium oxide ("IGO") or aluminum zinc oxide ("AZO"). However, the present disclosure is not limited thereto. The pixel electrode 220 may include various materials and may have a single-layer structure or a multilayer structure.

The intermediate layer 230 may be in the pixel area PA defined by the pixel-defining layer 219. The intermediate layer 230 includes an EML which emits light due to electrical signals and may further include a hole injection layer ("HIL") and a hole transport layer ("HTL"), which are between the EML and the pixel electrode 220, and an electron transport layer ("ETL") and an electron injection layer ("EIL"), which are between the EML and the opposite layer 240, in addition to the EML. The intermediate layer 230 may have a single-layer structure or multilayer structure in which at least one of the HIL, the HTL, the ETL and the EIL is stacked. However, the intermediate layer 230 is not limited thereto and may have various structures.

The opposite electrode 240 that covers the intermediate layer 230 including the EML and is opposite to the pixel electrode 220 may be over the entire flexible substrate 100. That is, the opposite electrode 240 may be commonly disposed with plural pixel areas PA. The opposite electrode 240 may be a (translucent) transparent electrode or a reflective electrode. The opposite electrode 240 in the non-bending area NBA may extend therefrom to be disposed in the bending area BA When the opposite electrode 240 is a (translucent) transparent electrode, the opposite electrode 240 may include a layer including a metal, for example, Li, Ca, lithium fluoride (LiF)/Ca, LiF/Al, Al, Ag, Mg, or a combination thereof, which has a relatively small work function and a (translucent) transparent conductive layer including ITO, IZO, ZnO, In$_2$O$_3$, or the like. When the opposite electrode 240 is a reflective electrode, the opposite electrode 240 may include a layer including Li, Ca, LiF/Ca, LiF/Al, Al, Ag, Mg, or a combination thereof. However, a structure and materials of the opposite electrode 240 are not limited thereto and may vary.

A thin film encapsulation layer 250 may be on the opposite electrode 240. The thin film encapsulation layer 250 may be over the entire first display unit 200 and may be a single layer or collectively multiple layers. When the thin film encapsulation layer 250 has a multilayer structure, the thin film encapsulation layer 250 may have a structure in which organic layers and inorganic layers or organic/inorganic combination layers are alternately stacked. The thin film encapsulation layer 250 may protect the first display unit 200 from penetration of external moisture.

The transparent area TA of the first display unit 200 may be in the bending area BA of the flexible substrate 100. As described above, the OLED may not be placed in the transparent area TA. Instead, the transparent area TA may include at least one transparent window TW, and light emitted from the second display unit 300 may penetrate the flexible substrate 100 to be finally emitted from the first display unit 200 through the transparent window TW thereof.

As shown in FIG. 2, at the transparent window TW, the buffer layer 211, the gate insulating layer 213, the interlayer insulating layer 215, the opposite electrode 240 and the thin film encapsulation layer 250 may be arranged. In another example, at the transparent window TW, only the opposite electrode 240 or the thin film encapsulation layer 250 may be placed and the buffer layer 211, the gate insulating layer 213, the interlayer insulating layer 215 may not be placed. In still another example, at the transparent window TW, the opposite electrode 240 or the thin film encapsulation layer 250 may not be placed and portions of the buffer layer 211, the gate insulating layer 213 or the interlayer insulating layer 215 may be place and exposed at the transparent window TW by an opening of the first display unit 200. In another example, no layers among the buffer layer 211, the gate insulating layer 213, the interlayer insulating layer 215, the opposite electrode 240 and the thin film encapsulation layer 250 may be at the transparent window TW of the transparent area TA, and the flexible substrate 100 may be exposed at the transparent window TW by an opening of the first display unit 200.

For the illustrated embodiment, in an embodiment of manufacturing a flexible display apparatus, the transparent window TW of the transparent area TA that is in the bending area BA may be patterned to have substantially the same size as each pixel area PA in the non-bending area NBA. Although FIG. 2 shows only one single transparent window TW, there may be multiple transparent windows TW in the transparent area TA in the bending area BA (refer to FIG. 1).

As shown in FIG. 2, some insulating layers may be at the transparent window TW of the transparent area TA. In order for the light, which is emitted from the second display unit 300, to penetrate through the transparent window TW of the transparent area TA, the buffer layer 211, the gate insulating layer 213 and the interlayer insulating layer 215 at the transparent window TW of the transparent area TA including a transparent or translucent material. Also, the thin film encapsulation layer 250 at the transparent window TW includes a same material as above, that is, a transparent or translucent material. As shown in FIG. 2, when the opposite electrode 240 is formed over the entire flexible substrate 100 and placed at the transparent window TW of the transparent area TA, the opposite electrode 240 also includes a transparent or translucent material.

The second display unit 300 may be on the second surface 100b of the flexible substrate 100. The second display unit 300 may be in the bending area BA of the second surface 100b of the flexible substrate 100. That is, it will be understood that the second display unit 300 may be at a location corresponding to the transparent area TA of the first display unit 200 on the first surface 100a of the flexible substrate 100. That is, instead of placing the light-emitting OLEDs in the transparent area TA of the first display unit 200 to provide light at the bending area BA, the light, which is emitted from the second display unit 300 placed on the second surface 100b of the flexible substrate 100 to correspond to the transparent area TA at the bending area BA, may be emitted towards the first display unit 200 through the flexible substrate 100. As such, light is emitted from the flexible display apparatus 1 at each of the bending and non-bending areas BA and NBA, merely from discrete light-generating and emitting elements disposed at different sides of the flexible substrate 100.

The second display unit 300 includes a flexible substrate 310 different from the base flexible substrate 100 of the overall flexible display apparatus 1, a TFT provided in plurality on the flexible substrate 310, and a LED provided in plurality and electrically connected to the TFTs.

Although FIG. 2 shows that a semiconductor layer 312 of the TFT is directly on the flexible substrate 310, in some cases, a buffer layer (not shown) may be between the semiconductor layer 312 and the flexible substrate 310. A gate electrode 314 above the semiconductor layer 312 may overlap at least some portions of the semiconductor layer 312, and a gate insulating layer 313 may be between the semiconductor layer 312 and the gate electrode 314 in order to insulate the semiconductor layer 312 and the gate electrode 314 from each other. A source electrode 316 (or a drain electrode) and a drain electrode 318 (or a source electrode) may be on an interlayer insulating layer 315 placed on the gate electrode 314. The source electrode 316 and the drain electrode 318 may each be electrically connected to the semiconductor layer 312 through contact holes respectively formed or defined in the interlayer insulating layer 315 and the gate insulating layer 313.

The TFT of the second display unit 300 is substantially the same as the TFT of the first display unit 200, and thus repeated descriptions thereof will be omitted.

In addition, in the illustrated embodiment, the TFTs of the first display unit 200 and the second display unit 300 are of a top gate type in which a gate electrode is on an upper surface of an active layer. However, the invention is not limited thereto. The gate electrode may be under a lower surface of the active layer to define a bottom gate type TFT.

A first insulating layer 330 may be on the TFT and thus may protect and flatten an upper surface of the TFT. The first insulating layer 330 may include or define a concave portion 330a. A first electrode 319 and a second electrode 320 placed on the interlayer insulating layer 315 may be exposed to outside the first insulating layer 330 at and by the concave portion 330a. An LED 350 may be mounted in the concave portion 330a and may be electrically connected to the first electrode 319 and the second electrode 320 which are exposed at the concave portion 330a. The LED 350 may generate and emit light of the second display unit 300. The LED 350 and/or the concave portion 330a may be provided in plurality within the second display unit 300. The LEDs 350 may be in one-to-one correspondence with the concave portions 330a, or in multiple-to-one correspondence with the concave portions 330a. In the illustrated embodiment, the first electrode 319 may be an extension of the drain electrode 318 (or the source electrode) of the TFT. In another embodiment, the first electrode 319 may be a separate layer from the layers forming the TFT of the second display unit 300.

The first electrode 319 may be a reflective electrode and may include at least one layer. In an embodiment, for example, the first electrode 319 may include a metal material layer such as Al, Mo, Ti, Ti/W, Ag, Au, or a combination thereof. The first electrode 319 may include a reflective layer and a transparent conductive layer including a transparent conductive oxide ("TCO") such as ITO, IZO, ZnO, or In2O3, or a conductive material such as a carbon nano tube film or a transparent conductive polymer. In an embodiment, the first electrode 319 may be a trilayer including an upper transparent layer and a lower transparent layer with a reflective layer therebetween.

The second electrode 320 may be a transparent or translucent electrode. In an embodiment, for example, the second electrode 320 may include the aforementioned transparent conductive material and at least one material selected from among Ag, Al, Mg, Li, Ca, Cu, LiF/Ca, LiF/Al, MgAg, and CaAg.

The LED 350 may be a micro LED. Although the term 'micro' herein indicates a size of about 1 μm to about 100 μm, but the present disclosure is not limited thereto. The term 'micro' may indicate a size smaller or greater than the above size. In an embodiment of manufacturing a flexible display apparatus, the LEDs 350 may be individually or collectively picked up and transported by a transport device on a wafer to the flexible substrate 310 with layers of the second display unit 300 thereon on which the LEDs 350 are to be disposed, and mounted in respectively the concave portion 330a defined on the flexible substrate 310. The LED 350 may be a red, green, blue or white LED or an ultraviolet ("UV") LED.

The LED 350 may include a p-n diode (not shown), a first contact electrode (not shown) and a second contact electrode (not shown). The first contact electrode and/or the second contact electrode may include at least one layer and various conductive materials, for example, metals, conductive oxides, and conductive polymers. Each of the first contact electrode and the second contact electrode may selectively include a reflective layer, for example, an Ag layer. The first contact electrode is electrically connected to the first electrode 319, and the second contact electrode is electrically connected to the second electrode 320. In an embodiment, the p-n diode may include a p-doping layer, at least one quantum well layer, and an n-doping layer.

FIG. 2 shows a horizontal micro LED. However, the present disclosure is not limited thereto. The LED 350 may be a flip-type LED in which the first contact electrode and the second contact electrode are arranged in the same direction, a vertical micro LED, or the like. In this case, locations of the first electrode and the second electrode may correspond to locations of the first contact electrode (not shown) and the second contact electrode (not shown) of the LED 350.

Although not shown, the LED 350 may further include a reflective layer, etc. between the flexible substrate 310 and the LED 350 in order to reflectively emit light towards the flexible substrate 100.

A second insulating layer 340 may be on the LED 350 to protect the LED 350 and flatten an upper surface of the LED 350. The second insulating layer 340 and the first insulating layer 330 described above may be organic insulating layers. The organic insulating layers may include an acryl-based polymer such as PMMA, PS, a polymer derivative having a phenol group, an imide-based polymer, an aryl ether-based polymer, an amide-based polymer, a fluorine-based polymer, a p-xylene-based polymer, a vinyl alcohol-based polymer, or any combination thereof.

An adhesive layer 510 may be between the second display unit 300 and the second surface 100b of the flexible substrate 100. That is, the second display unit 300 may be adhered to the second surface 100b of the flexible substrate 100 through the adhesive layer 510. In this case, the adhesive layer 510 may include a transparent adhesive material since the adhesive layer 510 is placed in a direction in which light is emitted from the second display unit 300. The adhesive layer 510 may include, for example, an optically clear adhesive ("OCA"), optically clear resin ("OCR"), or the like.

A protection film 400 may be on the second surface 100b of the flexible substrate 100. As shown in FIG. 2, the protection film 400 may be on a portion of the second surface 100b on which the second display unit 300 is not placed. That is, when the second display unit 300 is at the location corresponding to the bending area BA of the flexible substrate 100, the protection film 400 may be at a location corresponding to the non-bending area NBA of the flexible substrate 100. An adhesive layer 520 may be between the protection film 400 and the flexible substrate 100. Materials of the adhesive layer 520 and the adhesive layer 510 may be the same or different from each other. The protection film 400 may include a flexible plastic material, for example, PET.

The protection film 400 and the second display unit 300 may be spaced apart from each other by a certain interval such as by a groove 530 that may be formed therebetween. The groove 530 may be disposed at a boundary (dotted line in FIG. 2) where the bending area BA and the non-bending area NBA meet. In another embodiment, the protection film 400 and the second display unit 300 may contact each other at an interface of the bending and non-bending areas BA and NBA. In this case, one of the adhesive layer 510 or 520 may extend to define the other one of the adhesive layer 510 and 520.

Referring to FIGS. 1 and 2, the first display unit 200 may include OLEDs, and the second display unit 300 may include LEDs. Referring to the unbent state of the flexible display apparatus 1 in FIG. 2, the flexible substrate 100 may be disposed in an x-y plane defined by the x-axis direction and the y-axis direction. In the plane of the flexible substrate 100, the OLEDs may be spaced apart from one another by a first interval in a direction (an x-axis direction and/or a y-axis direction), and the LEDs are spaced apart from each other by a second interval in a direction (an x-axis direction and/or a y-axis direction). In an embodiment, the OLEDs correspond to pixel areas PA and the LEDs correspond to transparent windows TW, such that the pixel areas PA are spaced apart from one another by the first interval in a direction (an x-axis direction and/or a y-axis direction), and the transmission windows TW are spaced apart from each other by the second interval in a direction (an x-axis direction and/or a y-axis direction). In the illustrated embodiment, the first interval may be the same as the second interval. In another embodiment, the first interval may be different from the second interval.

In a conventional flexible display apparatus having OLEDs disposed on a same surface at both a bending area and a non-bending area, the yield and reliability of the entire flexible display apparatus decreases due to the frequent occurrence of defects in the OLEDs in the bending area.

In one or more embodiment of the flexible display apparatus 1, the first display unit 200 on the first surface 100a of the flexible substrate 100 includes the transparent area TA to correspond to the bending area BA, and through the transparent area TA, light emitted from the second display unit 300 that is on the opposing second surface 100b of the flexible substrate 100 may pass through the flexible substrate 100 to be disposed at the first surface 100a thereof. In the illustrated embodiment, the LEDs 350 at the opposing second surface 100b are included in the second display unit 300 in a micro unit such that the reliability of the flexible display apparatus 1 including light-emitting elements in the bending area BA may be improved.

In addition, as the first display unit 200 of the flexible display apparatus 1 includes the transparent window TW, images may be freely displayed at the bending area BA through an image generated by the second display unit 300. In particular, even when the first display unit 200 does not emit light and an image is not generated by the first display unit 200, certain information, etc. may still be displayed on the bending area BA through image-generation by the second display unit 300 using light.

FIG. 3 is a schematic perspective view of another embodiment of a flexible display apparatus 2 according to the invention, and FIG. 4 is a schematic cross-sectional view taken along line IV-IV' of the flexible display apparatus 2 of FIG. 3. The flexible display apparatus 2 is shown in a bent state in FIG. 3. The bent flexible display apparatus 2 of FIG. 3 is shown in an unbent state thereof in FIG. 4.

Referring to FIG. 3, the flexible display apparatus 2 includes the flexible substrate 100 having the first surface 100a and the second surface 100b, the first display unit 200 arranged on the first surface 100a of the flexible substrate 100 and including the transparent area TA, and the second display unit 300 on the second surface 100b of the flexible substrate 100 and generating and emitting light at the transparent area TA.

The flexible substrate 100 of the flexible display apparatus 2 according to the embodiment of FIG. 3 includes the bending area BA and the non-bending area NBA, and a structure corresponding to the bending area BA of the flexible display apparatus 2 is different from that corresponding to the flexible display apparatus 1 of FIG. 1. Thus, a difference between the structures corresponding to the bending areas BA will be mainly described. Descriptions regarding the pixels P, pixel areas PA, the protection film 400, and the like, which are at locations corresponding to the non-bending area NBA, are the same as those provided with reference to FIG. 1 and thus are not repeated.

Referring to FIG. 3, in the flexible display apparatus 2, the first display unit 200 may include the transparent (or transmission) area TA at a location corresponding to the bending area BA.

The transparent area TA may include the transparent window TW, and the transparent window TW may be understood as defined by or at the first opening OP1 in a collective insulating layer. In particular, the first display unit 200 may include the individual planarization layer 217 and pixel-defining layer 219 as the collective insulating layer, and the transparent window TW defined with the first opening OP1 may be formed or defined in the collective insulating layer planarization layer 217 and pixel-defining layer 219. FIG. 4 shows that the transparent window TW may be formed or defined in or by the planarization layer 217 and the pixel-defining layer 219. However, in another embodiment, the transparent window TW may be formed in only one of the planarization layer 217 and the pixel-defining layer 219.

The transparent window TW may be provided singularly in the transparent area TA. The single transparent window TW may have substantially a same planar size as that of the overall non-bending area NBA. That is, as shown in FIGS. 3 and 4, the single transparent window TW in the transparent area TA may have a greater planar size than each pixel area PA in the non-bending area NBA or a planar size corresponding to the entire transparent area TA.

In the illustrated embodiment, the transparent area TA may include the transparent window TW corresponding to the first opening OP1. Unlike the transparent window TW of the first flexible display apparatus 1 that is patterned to have a planar size substantially the same to that of the pixel area PA, the transparent window TW of the embodiment in FIGS. 3 and 4 may expose the entire bending area BA of the flexible substrate 100. That is, light-transmitting properties of layers at the single transparent window TW may allow light to be transmitted at an entire of the bending area BA. In another embodiment, a side or the other side of the transparent window TW may be open. In other words, a portion of the first display unit 200, in which the transparent window TW of the transparent area TA is placed, may correspond to the bending area BA of the flexible substrate 100.

Referring to FIG. 4, the first display unit 200 may include the transparent area TA including the transparent window TW, and the transparent window TW may correspond to the entire bending area BA of the flexible substrate 100. Thus, in the second display unit 300 on the second surface 100b of the flexible substrate 100, plural LEDs 350 may correspond to the single transparent window TW of the transparent area TA.

Referring to FIG. 4, the first insulating layer 330, in which the concave portion 330a are formed or defined in plurality, may be on the flexible substrate 310, and a plurality of LEDs 350 may be respectively mounted in the concave portions 330a. FIG. 4 shows that the LEDs 350 are directly on the flexible substrate 310. However, various layers may be disposed on the flexible substrate 310, and the LEDs 350 may be on any of these layers (refer to FIG. 2, for example). In an embodiment, for example, a TFT may be on the flexible substrate 310, a planarization layer may cover the TFT, and an electrode electrically connected to the TFT may be on the planarization layer.

In the illustrated embodiment, the LED 350 may be a micro LED. Although the term 'micro' herein indicates a size of about 1 μm to about 100 μm, but the present disclosure is not limited thereto. The term 'micro' may indicate a size smaller or greater than the above size. In an embodiment of manufacturing a flexible display apparatus, the LEDs 350 may be individually or collectively picked up and transported by a transport device on a wafer to the flexible substrate 310 and thereby respectively mounted in the concave portions 330a. Each LED 350 may be a red, green, blue or white LED or a UV LED.

Descriptions regarding the LEDs 350 and a structure of the second display unit 300 including the same are the same as those provided with reference to FIG. 2 and thus are not repeated.

In a conventional flexible display apparatus having OLEDs disposed on a same surface at both a bending area and a non-bending area, the yield and reliability of the entire flexible display apparatus decreases due to the frequent occurrence of defects in the OLEDs in the bending area.

In one or more embodiment of the flexible display apparatus 2, the first display unit 200 on the first surface 100a of the flexible substrate 100 includes the transparent area TA at the location corresponding to the bending area BA, and the light emitted from the second display unit 300 on the opposing second surface 100b of the flexible substrate 100 through the transparent window TW of the transparent area TA may penetrate the flexible substrate 100 to be disposed at the first surface 100a thereof. In the illustrated embodiment, the second display unit 300 includes the LEDs 350 at the opposing second surface 100b in a micro unit such that the reliability of the flexible display apparatus 2 including the bending area BA may be improved.

In addition, as the first display unit 200 of the flexible display apparatus 2 includes the transparent window TW, images may be freely displayed at the bending area BA through an image generated by the second display unit 300, and in particular, even when the first display unit 200 does not emit light and an image is not generated by the first display unit 200, certain information, etc. may be displayed only on the bending area BA through image-generation by the second display unit 300 using light.

According to the one or more embodiments of the present disclosure, a flexible display apparatus that is relatively easily bent may be implemented. However, the scope of the present disclosure is not limited thereto.

It should be understood that embodiments described herein should be considered in a descriptive sense only and not for purposes of limitation. Descriptions of features or features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
   a flexible substrate comprising a first surface and a second surface which is opposite to the first surface;
   a first display unit which displays an image with light and is on the first surface of the flexible substrate, the first display unit comprising:
      a first light-emitting element which generates light of the first display unit, and
      a transmission area at which light transmitted through the flexible substrate passes through the first display unit to outside the first display unit; and
   a second display unit which displays an image with light and is on the second surface of the flexible substrate, the second display unit comprising a second light-emitting element which generates light of the second display unit, the second light-emitting element disposed corresponding to the transmission area of the first display unit on the first surface of the flexible substrate.

2. The flexible display apparatus of claim 1, wherein the first light-emitting element comprises: a pixel electrode, an opposite electrode opposite to the pixel electrode, and an intermediate layer between the pixel electrode and the opposite electrode and comprising an emission layer.

3. The flexible display apparatus of claim 1, wherein in a same direction within a plane of the flexible substrate,
   the first light-emitting element is provided in plurality spaced apart from one another on the first surface of the flexible substrate by a first interval, and
   the second light-emitting element is provided in plurality spaced apart from one another on the second surface of the flexible substrate by a second interval which is the same as the first interval.

4. The flexible display apparatus of claim 1, wherein in a same direction within a plane of the flexible substrate,
   the first light-emitting element is provided in plurality spaced apart from one another on the first surface of the flexible substrate by a first interval, and
   the second light-emitting element is provided in plurality spaced apart from one another on the second surface of the flexible substrate by a second interval which is different from the first interval.

5. The flexible display apparatus of claim 1, wherein the second light-emitting element is a light-emitting diode comprising a p-n diode.

6. The flexible display apparatus of claim 1, wherein the second light-emitting element is a light-emitting diode having a size of about 1 micrometer to about 100 micrometers.

7. The flexible display apparatus of claim 1, wherein the second light-emitting element is a horizontal micro light-emitting diode.

8. The flexible display apparatus of claim 1, wherein
at the transmission area of the first display unit, the first display unit comprises an insulating layer disposed on the first surface of the flexible substrate, and
a first opening is defined in the insulating layer of the first display unit, the first opening defining a transparent window of the transmission area at which the light from the flexible substrate passes through the first display unit to the outside of the first display unit.

9. The flexible display apparatus of claim 8, wherein the second light-emitting element on the second surface of the flexible substrate is disposed at the first opening of the first display unit disposed on the first surface of the flexible substrate.

10. The flexible display apparatus of claim 8, wherein
the flexible substrate further comprises a bending area at which the flexible display apparatus is bent and a non-bending area at which the flexible display apparatus is not bent,
the first opening defining the transparent window of the first display unit is disposed at the bending area of the flexible substrate,
the first display unit further comprises a second opening in the non-bending area of the flexible substrate, the second opening defining a pixel area at which the emitted light from the first light-emitting element is emitted to the outside of the first display unit, and
in a plane of the flexible substrate, a planar area of the first opening defining the transparent window of the first display unit is the same as a planar area of the second opening defining the pixel area of the first display unit.

11. A flexible display apparatus comprising:
a flexible substrate comprising:
a first surface and a second surface which is opposite to the first surface,
a bending area at which the flexible display apparatus is bent, and
a non-bending area at which the flexible display apparatus is not bent,
a first display unit which displays an image with light and is on the first surface of the flexible substrate, the first display unit comprising a transmission area at which light transmitted through the flexible substrate passes through the first display unit to outside the first display unit, and
a second display unit which displays an image with light and is on the second surface of the flexible substrate, the second display unit disposed corresponding to the transmission area of the first display unit on the first surface of the flexible substrate,
wherein the transmission area of the first display unit is disposed at the bending area of the flexible substrate.

12. The flexible display apparatus of claim 11, wherein
the first display unit further comprises a first light-emitting element disposed on the first surface of the flexible substrate at the non-bending area thereof,
the second display unit further comprises a second light-emitting element disposed on the second surface of the flexible substrate at the bending area thereof, and
the emitted light from each of the first and second light-emitting elements exits to outside the first display unit from the first display unit.

13. The flexible display apparatus of claim 12, wherein the first display unit further comprises:
a first opening thereof which is in the bending area of the flexible substrate and defines a transparent window of the transmission area at which the emitted light from the second light-emitting element passes through the first display unit to the outside of the flexible display apparatus, and
a second opening which is in the non-bending area of the flexible substrate and defines a pixel area at which the emitted light from the first light-emitting element exits to the outside of the flexible display apparatus.

14. The flexible display apparatus of claim 13, wherein
a single one of the transparent window of the first display unit is provided in the bending area of the flexible substrate to correspond to an entirety of the bending area, and
the second light-emitting element is provided in plurality at the single one transparent window.

15. The flexible display apparatus of claim 13, wherein
the transparent window of the first display unit is provided in plurality within the bending area of the flexible substrate, and
the second light-emitting element is provided in plurality respectively at the plurality of transparent windows.

16. A flexible display apparatus comprising:
a flexible substrate comprising a first surface and a second surface which is opposite to the first surface;
a first display unit which displays an image with light and is on the first surface of the flexible substrate, the first display unit comprising a transmission area at which light transmitted through the flexible substrate passes through the first display unit to outside the first display unit; and
a second display unit which displays an image with light and is on the second surface of the flexible substrate, the second display unit disposed corresponding to the transmission area of the first display unit on the first surface of the flexible substrate,
wherein
the flexible substrate further comprises a bending area at which the flexible display apparatus is bent and a non-bending area at which the flexible display apparatus is not bent, and
the second display unit is disposed at the bending area of the flexible substrate,
further comprising a protection film on the second surface of the flexible substrate at the non-bending area of the flexible substrate.

17. The flexible display apparatus of claim 16, wherein the protection film on the second surface of the flexible substrate is disposed non-overlapping the second display unit on the second surface of the flexible substrate.

18. A flexible display apparatus comprising:
a flexible substrate comprising a first surface and a second surface which is opposite to the first surface;
a first display unit which displays an image with light and is on the first surface of the flexible substrate, the first display unit comprising a transmission area at which light transmitted through the flexible substrate passes through the first display unit to outside the first display unit;
a second display unit which displays an image with light and is on the second surface of the flexible substrate, the second display unit disposed corresponding to the transmission area of the first display unit on the first surface of the flexible substrate; and
an adhesive layer between the second display unit and the second surface of the flexible substrate, the adhesive layer having transparency.

* * * * *